US008222121B2

(12) United States Patent
Patti et al.

(10) Patent No.: US 8,222,121 B2
(45) Date of Patent: Jul. 17, 2012

(54) FIDUCIAL SCHEME ADAPTED FOR STACKED INTEGRATED CIRCUITS

(75) Inventors: Robert Patti, Warrenville, IL (US);
Sangki Hong, Singapore (SG);
Chockalingam Ramasamy, Singapore (SG)

(73) Assignee: Tezzaron Semiconductor, Inc., Naperville, IL (US)

( * ) Notice: Subject to any disclaimer, the term of this patent is extended or adjusted under 35 U.S.C. 154(b) by 0 days.

(21) Appl. No.: 13/004,642

(22) Filed: Jan. 11, 2011

(65) Prior Publication Data
US 2011/0117701 A1 May 19, 2011

Related U.S. Application Data

(62) Division of application No. 11/385,941, filed on Mar. 20, 2006, now Pat. No. 7,898,095.

(51) Int. Cl.
*H01L 21/00* (2006.01)
(52) U.S. Cl. . 438/462; 438/109; 438/110; 257/E23.179; 257/774; 257/797
(58) Field of Classification Search .................. 438/109, 438/110, 118, 459, 462; 257/E21.499, E25.017, 257/E23.179, 685, 686, 771, 773, 774, 777, 257/737, 797; 430/314
See application file for complete search history.

(56) References Cited

U.S. PATENT DOCUMENTS

| | | | | | |
|---|---|---|---|---|---|
| 5,380,681 | A | * | 1/1995 | Hsu | 438/109 |
| 5,627,106 | A | * | 5/1997 | Hsu | 438/459 |
| 5,682,062 | A | * | 10/1997 | Gaul | 257/686 |
| 6,566,232 | B1 | * | 5/2003 | Hara et al. | 438/455 |
| 6,642,081 | B1 | * | 11/2003 | Patti | 438/109 |
| 7,354,798 | B2 | * | 4/2008 | Pogge et al. | 438/109 |
| 7,385,283 | B2 | * | 6/2008 | Wu et al. | 257/686 |

* cited by examiner

*Primary Examiner* — Chris Chu
(74) *Attorney, Agent, or Firm* — Calvin B. Ward

(57) ABSTRACT

A method for stacking integrated circuit substrates and the substrates used therein are disclosed. In the method, an integrated circuit substrate having top and bottom surfaces is provided. The substrate is divided vertically into a plurality of layers including an integrated circuit layer having integrated circuit elements constructed therein and a buffer layer adjacent to the bottom surface. An alignment fiducial mark extending from the top surface of the wafer into the substrate to a depth below that of the circuit layer is constructed. The vias are arranged in a pattern that provides a fiducial mark when viewed from the bottom surface of the substrate. The pattern can be chosen such that it is recognized by a commercial stepper/scanner/contact mask aligner when viewed from said backside of said wafer. After the substrate is thinned, the alignment fiducial mark is then used to position a mask used in subsequent processing.

6 Claims, 4 Drawing Sheets

FIDUCIAL SCHEME ADAPTED FOR STACKED INTEGRATED CIRCUITS

CROSS REFERENCE TO RELATED APPLICATIONS

This is a divisional of co-pending application Ser. No. 11/385,941 filed on Mar. 20, 2006 now U.S. Pat. No. 7,898,095.

BACKGROUND OF THE INVENTION

Modern integrated circuits are typically constructed in a thin layer in a semiconducting layer on a substrate wafer such as silicon. This essentially two-dimensional structure limits both the size of the integrated circuit and the speed at which the circuit operates. The distance between the farthest separated components that must communicate with one another on the chip determines the speed at which an integrated circuit operates. For any given number of components, the path lengths will, in general, be significantly reduced if the circuit can be laid out as a three-dimensional structure consisting of a number of vertically-stacked layers of circuitry, provided the vertical distances between the layers are much smaller than the width of the chips that make up the individual layers.

The circuitry that can be economically constructed on any type of wafer is also limited. For example, the fabrication processes utilized for constructing CCD optical sensors do not lend themselves to constructing CMOS logic circuits. Hence, an optical sensor having a CCD array and the corresponding logic circuits must be broken into two substrates that are connected electrically after the circuit elements on each substrate have been fabricated. Prior art versions of such hybrid circuits are limited in the number of inter-substrate connections that can be utilized.

One promising scheme for providing stacked structures utilizes a method for stacking and bonding entire wafers. In this method, integrated circuits are fabricated on conventional wafers. The circuitry on the front surface of each wafer is covered with an insulating layer having metallic pads that make contact with the underlying circuitry and act as electrical connection points between the two wafers. The front surfaces of the wafers are then placed in contact with one another and bonded via thermal compression bonding. If more than two wafers are to be connected, one of the wafers is then thinned to a thickness of a few microns by etching or mechanically grinding the back surface of that wafer. Once the wafer has been thinned, a new set of pads is constructed on the backside of the thinned wafer. Some of these backside pads are connected to the circuitry on the front side of the wafer through metal-filled vias that connect the front and backsides of the thinned wafer. These backside pads provide the connection points for adding yet another wafer to the stack. The process is then repeated until the desired number of layers has been bonded to form the three-dimensional stack. The three-dimensional stack is then cut into three-dimensional chips and packaged.

In conventional wafer processing schemes, the front side of each wafer includes fiducial marks that are utilized in positioning the exposure projecting apparatus used in the various lithographic processing steps. The front sides of the wafers used in the stacking process described above include such fiducial marks. However, when the wafer is bonded by its front side to the stack of wafers and then thinned, there are no fiducial marks on the backside of the wafer. Hence, positioning the lithographic projector during the steps needed for the construction of the new set of pads on the backside of the wafer has problems. The current technology that is available for lithographic projection on the backside of stacked wafers results in a large misalignment (~5 um). In principle, the fiducial marks on the front side of the wafer can be utilized if the wafer is thinned sufficiently, allowing white-light alignment utilizing fiducial marks which are placed on the front side and become visible from the back side after thinning the wafer.

Alternatively the wafer is also reasonably transparent in the long wavelength portion of the spectrum. However, such long wavelength imaging provides only limited positioning accuracy.

SUMMARY OF THE INVENTION

The present invention includes a method for stacking integrated circuit substrates and the substrates used therein. In the present invention, an integrated circuit substrate having top and bottom surfaces is provided. The integrated circuit substrate is divided vertically into a plurality of layers including an integrated circuit layer extending into the integrated circuit substrate by a first distance from the top surface of the integrated circuit substrate and having integrated circuit elements constructed therein and a buffer layer adjacent to the bottom surface. The buffer layer is devoid of integrated circuit elements, the buffer layer is separated from the top surface of the integrated circuit substrate by a distance greater than or equal to the first distance. An alignment fiducial mark extending from the top surface of the integrated circuit substrate into the integrated circuit substrate by a second distance greater than the first distance is constructed in the integrated circuit substrate. The top surface of the integrated circuit substrate is bonded to a base substrate. The integrated circuit substrate is then thinned by removing material from the bottom surface of the integrated circuit substrate thereby exposing the fiducial mark as well as the plurality of vias. A lithographic patterned layer of material on the thinned integrated circuit substrate is then aligned by reference to the alignment fiducial mark. In one embodiment, the integrated circuit layer includes a plurality of vertical conductors constructed from metal-filled vias used to form electrical connections between the top and bottom surfaces of the integrated circuit layer. The alignment fiducial marks are formed during the process steps in which the metal-filled vias in the vertical conductors are formed in this embodiment. In one embodiment, the fiducial mark is one that is recognized by a commercial stepper, scanner or contact mask aligner when viewed from the backside of the thinned integrated circuit substrate. In one embodiment, the integrated circuit substrate is divided into a plurality of die areas surrounded by buffer areas, and the alignment fiducial mark is located in one of the buffer areas. In one embodiment, the integrated circuit substrate includes a plurality of the alignment fiducial marks, each alignment fiducial mark corresponding to a corresponding one of the die areas.

DETAILED DESCRIPTION OF THE INVENTION

Figure 1:
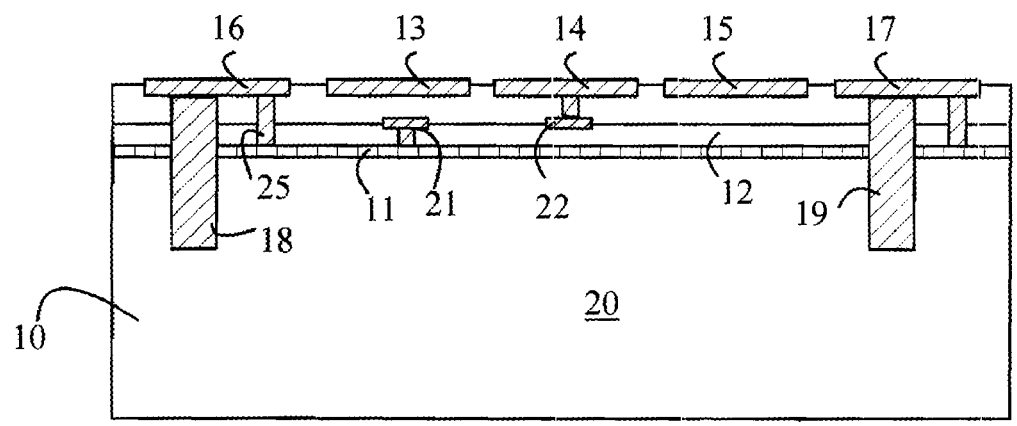
FIG. 1 is a cross-sectional view of a portion of a wafer 10 that is adapted for use in a wafer-stacking scheme.

The manner in which the present invention provides its advantages can be more easily understood with reference to the manner in which one prior art system for stacking integrated circuit wafers operates. Refer now to FIG. 1, which is a cross-sectional view of a portion of a wafer 10 that is adapted for use in a wafer-stacking scheme. Wafer 10 includes an integrated circuit layer 11 that includes integrated circuit elements that are constructed in the surface layer of a silicon substrate 20 in the conventional manner. The precise nature and structure of these circuit elements is not relevant to the present discussion, and hence, the construction of this layer will not be discussed in detail here. For the purposes of this discussion, it is sufficient to note that the circuit elements are confined to a layer of finite thickness that is located on a silicon substrate 20 that is devoid of circuit elements below this layer. A dielectric layer 12 having one or more layers is typically formed over the integrated circuit layer and various metal conductors are formed in and/or on this layer. Exemplary conductors that run perpendicular to the plane of the drawing are shown at 21 and 22. These conductors provide electrical connections to selected ones of the circuit elements in layer 11 through vertically running vias.

The top surface of dielectric layer 12 includes a number of metallic bonding pads 13-17. These pads serve two functions. First some of the pads provide electrical connection points for accessing circuitry in circuit layer 11. These pads are typically connected to one of the electrical conductors in dielectric layer 12. For example, pad 14 is connected to conductor 22, which, in turn, is connected to an element in circuit layer 11 by conductors that are not shown in the drawing. Similarly pad 16 is connected to circuit layer 11 by a vertical conductor shown at 25. Second, these pads bond this wafer to an adjacent wafer in a stack of wafers. This bonding process will be discussed in more detail below.

Wafer 10 also includes a number of deep contacts, 18 and 19, that connect a pad on the surface of dielectric layer 12 to a point that is a predetermined distance below circuit layer 11. These contacts provide connections to a wafer that will be bonded to wafer 10 by pads similar to those shown at 13-17 on the adjacent wafer. In addition, these contacts are utilized in a wafer thinning process as discussed below.

The manner in which a number of wafers such as wafer 10 are stacked to form a stacked assembly will now be discussed in more detail. The stacking process is an iterative process in which one wafer is added at a time to an ongoing stacked assembly. At any point in the stacking process there is a base wafer assembly comprising one or more wafers that have been previously stacked and a new wafer element that is to be added to the stack. The process starts by bonding wafer 10 to a base wafer or other substrate. For the purposes of this discussion, it will be assumed that a base wafer is utilized.

Figure 2:
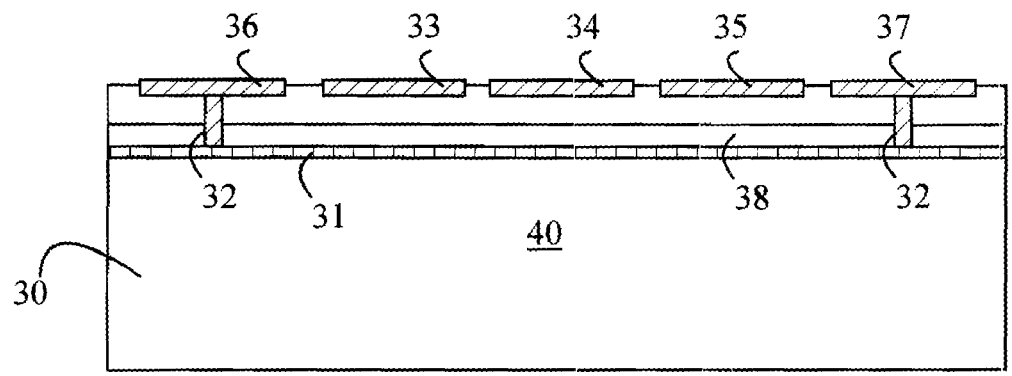
FIG. 2 is a cross-sectional view of a base wafer 30.

Refer now to FIG. 2, which is a cross-sectional view of a base wafer 30. Base wafer 30 includes an integrated circuit layer 31 that is analogous to circuit layer 11 discussed above. Circuit layer 31 is constructed on the surface of a substrate 40. A dielectric layer 38 is typically formed over circuit layer 31 and includes various metal conducting layers that are used to connect elements in circuit layer 31 to one another and to selected ones of the metal pads 33-37 on the surface of dielectric layer 38. To simplify the drawing, these metal conductors have been omitted from the drawing. In addition, direct vertical connections to selected ones of the pads are provided by metal-filled vias 32.

The pads on the surface of wafer 30 are arranged such that each pad will contact a corresponding pad on the surface of wafer 10 when wafer 10 is inverted and placed in contact with wafer 30. That is, pads 33-37 are positioned to contact pads 13-17, respectively, when the wafers are properly aligned. After the wafers are aligned, the wafers are pressed together and heated to a temperature of typically 300° C.-400° C. for a time sufficient for the pads to bond to one another by thermal compression bonding.

Figure 3:
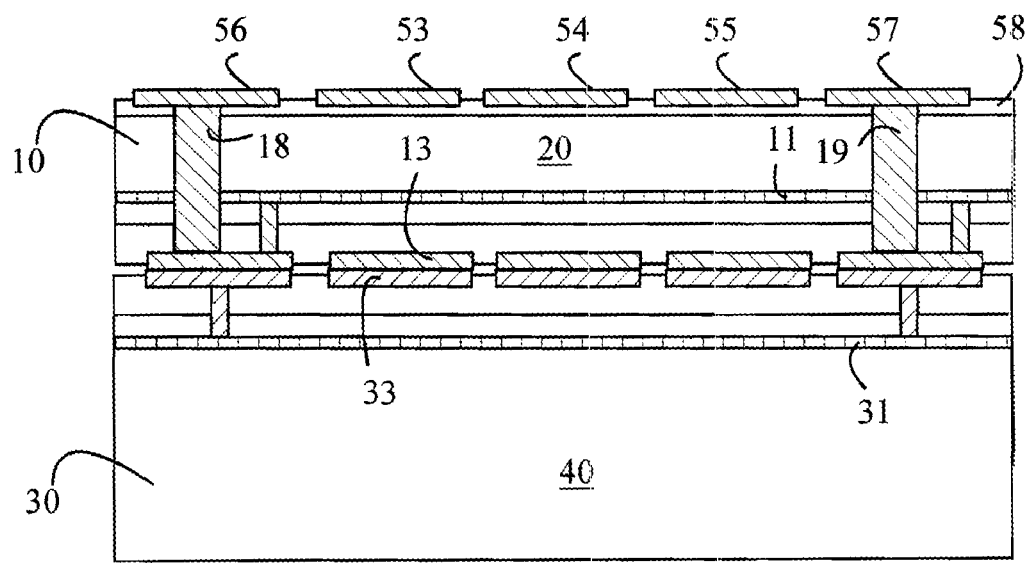
FIG. 3 is a cross-sectional view of a two layer stacked wafer assembly after wafer 10 has been bonded to wafer 30 and thinned.

Refer now to FIG. 3, which is a cross-sectional view of a two layer stacked wafer assembly after wafer 10 has been bonded to wafer 30 and thinned. The backside of wafer 10 is preferably thinned utilizing mechanical grinding, chemical mechanical polishing (CMP) and chemical wet and/or dry etching processes. The thinning process continues until the thinned surface is lower than the bottom surface of the deep contacts 18 and 19 by at least 0.2 µm height. That is, the ends of the deep contacts extend above the thinned surface after the thinning operation is completed. A dielectric layer 58 is then formed on the thinned wafer to electrically isolate the conductors in the deep vias from silicon substrate 20. Finally, a new set of metallic pads 53-57 is formed on the dielectric layer by referencing fiducial marks, which were formed simultaneously with the deep contacts. The manner in which the fiducial marks are formed will be discussed in more detail below. The pads are preferably inset into the dielectric layer as shown in the drawing. The two layer stacked wafer assembly can now be used as the base layer for the addition of yet another layer by the same process.

Figure 4:
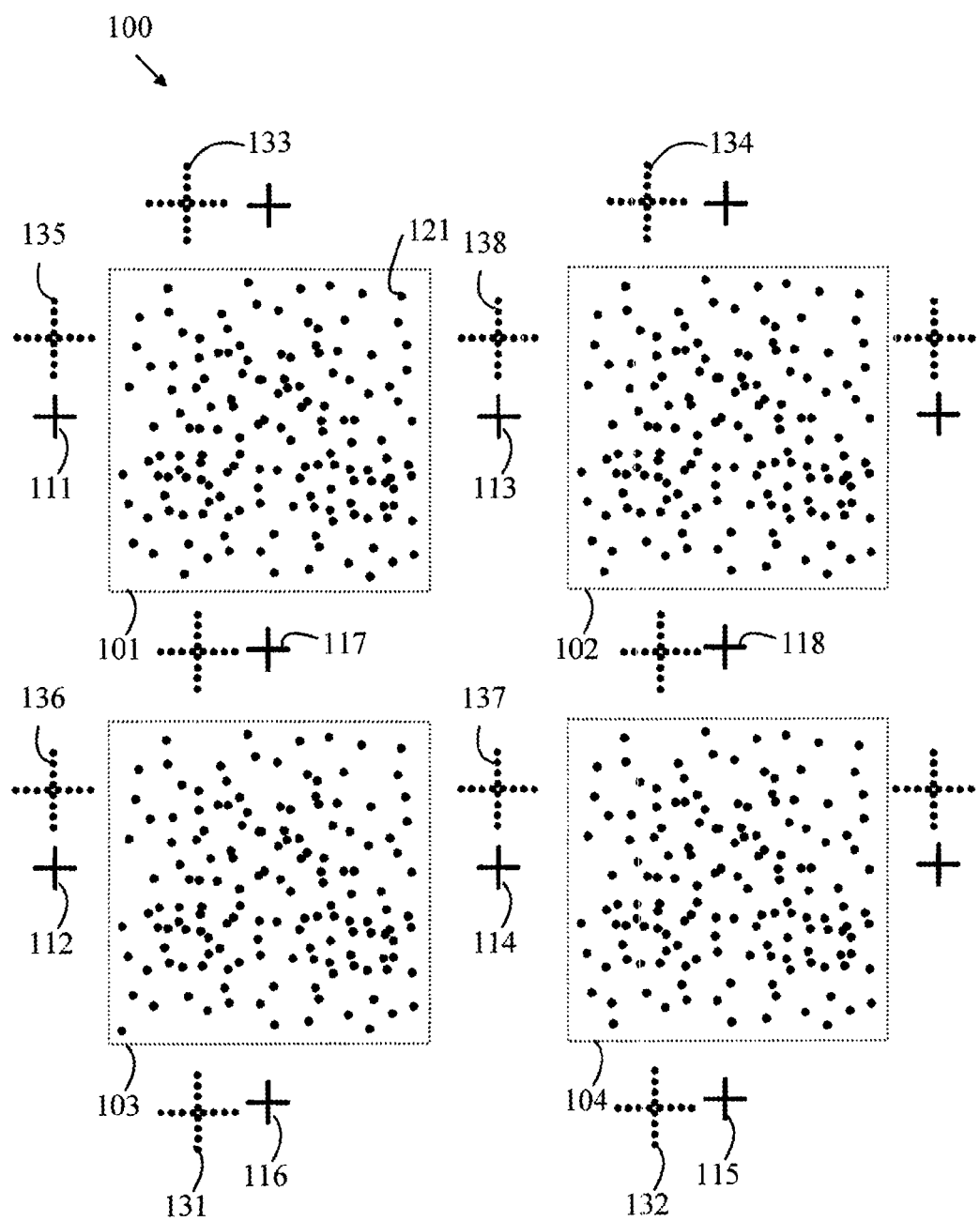
FIG. 4 is a top view of a portion of a wafer 100 at the point at which the deep contacts are constructed in the wafer.

Refer now to FIG. 4, which is a top view of a portion of a wafer 100 at the point at which the deep contacts are constructed in wafer 10. The wafer is divided into die areas shown at 101-104. The area between the dies will be cut to free the individual chips after the fabrication process is completed. The area between the dies includes a number of fiducial marks 111-118 that are used by the projection system to align the masks used in the various lithographic steps used in the fabrication of the circuitry within the die areas. These fiducial marks are used during the "front side" processing of the wafer. These are the local fiducial marks that are used by the stepper/scanner/aligner. In addition to these front side fiducial marks, some fabrication systems utilize additional front side fiducial marks that are often referred to as "zero marks" or "global alignment marks" that are etched in the wafer prior to the fabrication of the various transistors.

In one embodiment of the present invention, the deep contacts discussed above are etched from the surface of the wafer after the various transistors have been fabricated. Exemplary deep contacts within the die areas are shown at 121. The deep contacts are filled with a metal such as copper, tungsten, and aluminum or alloys thereof. The deep contacts are typically lined with a material such as of Ti, TiN, $Ti_xSi_yN_z$, Ta, TaN, $Ta_xSi_yN_z$, W, WN, and $W_2$ prior to filling with the metal. The lining inhibits the diffusion of the metal out of the vias. A dielectric layer such as $SiO_2$ or $Si_xN_y$ or a combination of these two, is deposited before the lining layer deposition in order to provide electrical isolation between the metal and buffer substrates (typically Si). In addition, both the lining layer and dielectric layer provide an etch stop function that can be used during the thinning process. While only a small number of deep contacts are shown in the drawing, it is to be understood that the number of such contacts is typically in the range of 10,000 to 500,000 per die area. These deep contacts also utilize the front side fiducial marks.

At the same time the deep contacts are etched, a set of fiducial marks is also created by etching a deep trench pattern in the areas between the dies in order to provide overlay accuracy when fabricating pads 53-57 on the thinned backside of the wafer. These fiducial marks will be referred to as backside fiducial marks in the following discussion. Exemplary backside fiducial marks are labeled at 131-138. Each fiducial mark consists of a number of deep trenches arranged in a pattern. In one embodiment of the present invention, the fiducial marks are etched in the same etching operations that are used to etch the deep contacts in the die area. It should be noted that no additional fabrication steps beyond those used to make the deep contacts in the die area are needed to provide the backside fiducial marks in this embodiment.

It should be noted that the geometry of the backside fiducial mark trenches is constrained by the geometry of the deep contacts. This constraint can be met by utilizing trenches that are similar in size to the deep contact vias and arranging these trenches in a pattern that provides a fiducial mark that appears to be a "dotted" pattern.

After the deep contacts are etched, the various metal and insulation layers are added to the top surface of the wafer to provide a wafer of the type discussed with reference to FIG. 1. The wafer is then turned over and bonded to the existing stack as described above. After bonding, the wafer is thinned to the point at which the metal in the bottoms of the deep contacts is exposed. The method used to thin the wafers is not critical to the present invention and hence will not be discussed in detail here. For the purposes of the present discussion, it is sufficient to note that the bottoms of the deep contacts can include a material that is more resistant to CMP than the surrounding silicon, and hence, this material acts as a CMP stop when CMP is used to thin the wafer.

Figure 5:
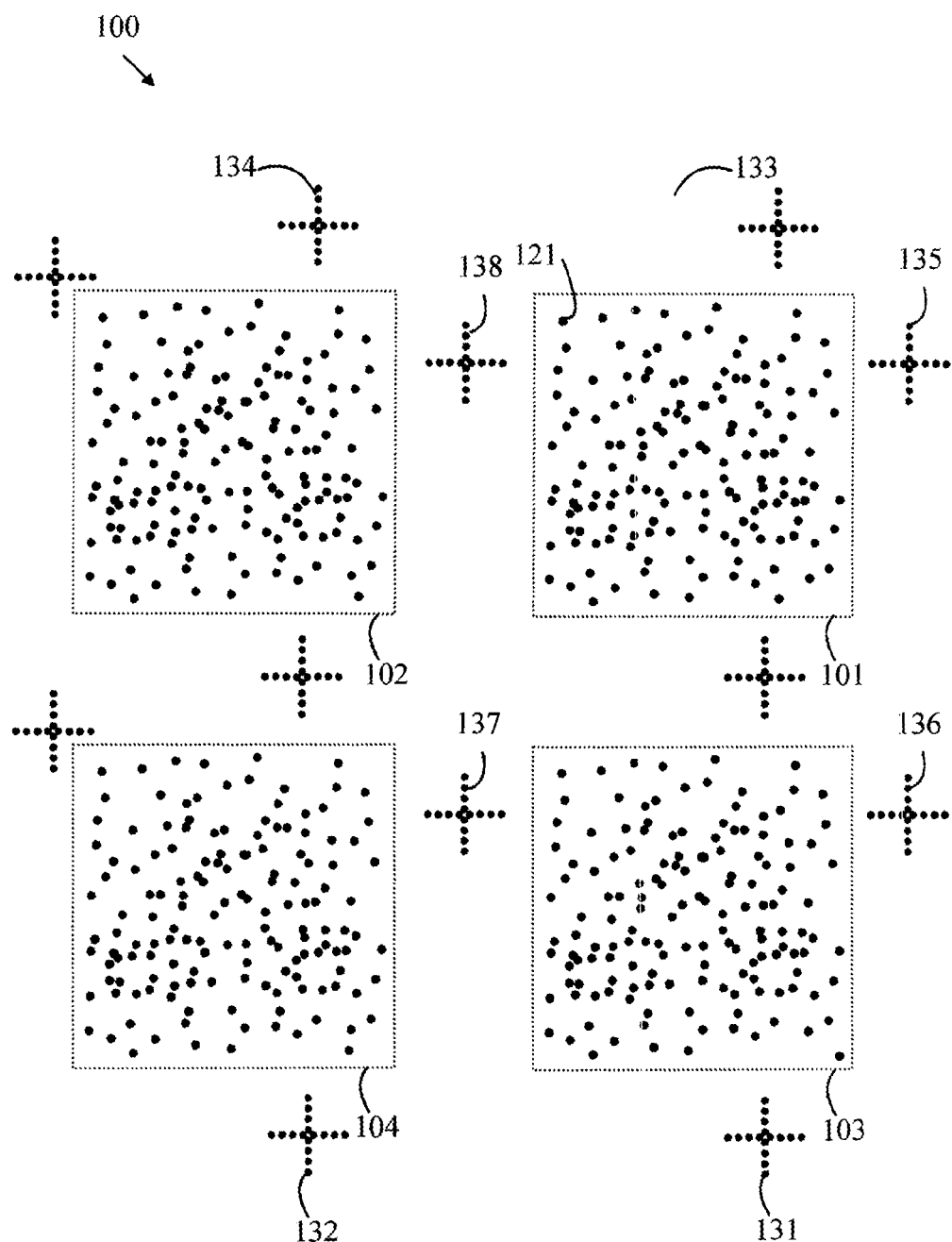
FIG. 5 is a view of the backside of the wafer shown in FIG. 4 after the wafer has been thinned but before the backside pads have been fabricated.

Refer now to FIG. 5, which is a view of the backside of the wafer shown in FIG. 4 after the wafer has been thinned but before the backside pads have been fabricated. Within the various die areas, the bottoms of the deep contacts used to make the vertical connections through the wafers are exposed as shown at 121. In the area between the dies, the bottoms of the fiducial deep contacts are also exposed and form fiducial marks that can be utilized by the stepper/scanner/aligner in the projection system to align the masks used to define the locations of the metal pads that are to be fabricated on the backside of the wafer. Hence, even though the front side fiducial marks are not visible, the new backside fiducial marks can now be used to position the masks used in printing, etching and depositing the backside metal pads.

It should be noted that the fiducial marks shown above have been in the form of a "+". However, various shapes of marks can be selected from the group of available fiducial marks offered by the alignment equipment manufacturer whose equipment is used in the lithographic process on the particular fabrication line. In general, the manufacturer of the stepper used in the lithography process specifies the shape of the fiducial pattern. The mirror image of this pattern is etched into the front side of the wafer.

Figure 6A:
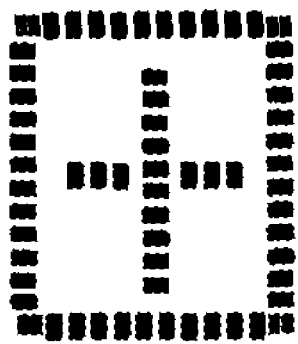
FIGS. 6A and 6B are top views of some exemplary fiducial marks.
Figure 6B:
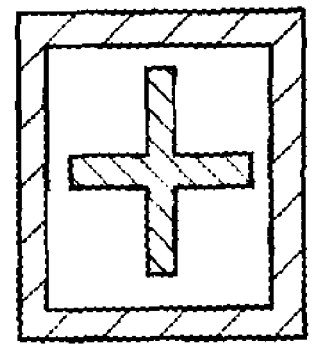

As noted above, there are some constraints in the geometry of the backside fiducial marks. Ideally, a fiducial mark is constructed from a number of small short line segments in which each line segment can be implemented as a single trench and the collection of trenches meets the limitations discussed above with respect to the constancy of the metal density on the surface and the trench sizes. However, if the fiducial mark would require trenches that are too large or would violate the geometry constraints, then the fiducial mark is implemented as a "dotted" pattern that has the same overall shape as the original mark, while still presenting an area of silicon that is similar in its metal coverage and metal feature sizes as the rest of the wafer. An example of a fiducial mark that is constructed from small trenches as described above is shown in FIG. 6A. A fiducial mark that presents a surface that is significantly different from the geometry of the other features on the backside of the wafer, and hence, must be converted to a dotted pattern is shown in FIG. 6B.

The above-described embodiments of the present invention utilize a fiducial mark system in which the fiducial marks are constructed in the same fabrication steps that are utilized for constructing the vias used to form vertical conductors that extend between the top and bottom surface of the wafer after the wafer has been thinned. This method is preferred since it minimizes the number of fabrication steps. However, the fiducial marks can be constructed in the wafer at any point in the fabrication process for that wafer. For example, the fiducial mark can be etched into the wafer before the integrated circuit elements are fabricated. Alternatively, the fiducial marks can be etched into the wafer after the integrated circuit elements have been fabricated and the vias used for vertical connections have been constructed. In addition, the fiducial marks can be fabricated during the fabrication of the integrated circuit elements if the particular circuit design includes steps that can be shared by the fiducial mark fabrication process.

Various modifications to the present invention will become apparent to those skilled in the art from the foregoing description and accompanying drawings. Accordingly, the present invention is to be limited solely by the scope of the following claims.

What is claimed is:

1. A method for stacking integrated circuit substrates comprising:
    providing an integrated circuit substrate having top and bottom surfaces, said integrated circuit substrate being divided vertically into a plurality of layers including an integrated circuit layer extending into said wafer by a first distance from said top surface of said wafer and having integrated circuit elements constructed therein and a buffer layer adjacent to said bottom surface, said buffer layer being devoid of integrated circuit elements, said buffer layer being separated from said top surface of said wafer by a distance greater than or equal to said first distance;
    constructing an alignment fiducial structure comprising a plurality of vias extending from said top surface of said wafer into said wafer by a second distance greater than said first distance, said vias being arranged in a pattern that comprises a fiducial mark;
    bonding said top surface of said integrated circuit substrate to a base substrate;
    thinning said integrated circuit substrate by removing material from said bottom surface of said integrated circuit substrate to create a thinned bottom surface thereby exposing said plurality of vias; and
    aligning a lithographic mask for depositing a patterned layer of material on said thinned integrated circuit substrate, said lithographic mask being aligned by reference to said alignment fiducial mark.

2. The method of claim 1 wherein said integrated circuit layer comprises a plurality of vertical conductors comprising a plurality of metal-filled vias used to form electrical connections between said top surface of said integrated circuit layer and said thinned bottom surface and wherein said vias in said alignment fiducial mark are fabricated as part of a process in which said metal-filled vias in said vertical conductors are constructed.

3. The method of claim 1 wherein said integrated circuit layer comprises a plurality of vertical conductors comprising a plurality of metal-filled vias used to form electrical connections between said top surface of said integrated circuit layer and said thinned bottom surface and wherein said vias in said alignment fiducial mark are fabricated in a process that is separate from a process in which said metal-filled vias in said vertical conductors are constructed.

4. The method of claim 1 wherein said pattern is one that is recognized by a commercial stepper/scanner/contact mask aligner when viewed from said backside of said integrated circuit substrate.

5. The method of claim 4 wherein said integrated circuit substrate is divided horizontally into a plurality of die areas surrounded by buffer areas, and wherein said alignment fiducial mark is located in one of said buffer areas.

6. The method of claim 5 further comprising a plurality of said alignment fiducial marks, each alignment fiducial mark corresponding to a corresponding one of said die areas.

* * * * *